(12) United States Patent
Adams et al.

(10) Patent No.: US 6,339,313 B1
(45) Date of Patent: Jan. 15, 2002

(54) FUEL CELL MANAGER

(75) Inventors: William A. Adams, Kemptville; Christopher L. Gardner, Dunrobin, both of (CA)

(73) Assignee: Estco Battery Management Inc., Nepean (CA)

( * ) Notice: Subject to any disclaimer, the term of this patent is extended or adjusted under 35 U.S.C. 154(b) by 0 days.

(21) Appl. No.: 09/706,858

(22) Filed: Nov. 7, 2000

Related U.S. Application Data

(63) Continuation-in-part of application No. 08/887,844, filed on Jul. 3, 1997, now Pat. No. 6,239,579.
(60) Provisional application No. 60/021,185, filed on Jul. 5, 1996.

(51) Int. Cl.[7] ............................ H02J 07/00; H01M 8/04
(52) U.S. Cl. ........................ 320/121; 320/162; 429/17
(58) Field of Search ................................. 320/121, 119, 320/162; 429/17

(56) References Cited

U.S. PATENT DOCUMENTS

| | | | | |
|---|---|---|---|---|
| 3,102,222 A | * | 8/1963 | Harmer | 320/119 |
| 3,930,192 A | * | 12/1975 | Dinkler | 320/119 |
| 4,484,140 A | | 11/1984 | Dieu | |
| 4,616,170 A | * | 10/1986 | Urstoger | 320/119 |
| 4,707,795 A | | 11/1987 | Alber et al. | |
| 4,709,202 A | * | 11/1987 | Koenck et al. | 320/112 |
| 5,153,496 A | * | 10/1992 | Laforge | 320/119 |
| 5,498,950 A | * | 3/1996 | Ouwerkerk | 320/119 |
| 5,543,245 A | | 8/1996 | Andrieu et al. | |
| 5,557,189 A | * | 9/1996 | Suzuki et al. | 320/119 |
| 5,583,440 A | * | 12/1996 | Bisher | 324/427 |
| 5,644,208 A | * | 7/1997 | Abven | 320/118 |
| 5,661,463 A | * | 8/1997 | Letchak et al. | 340/636 |
| 5,703,464 A | * | 12/1997 | Karunasiri et al. | 320/125 |
| 5,710,503 A | * | 1/1998 | Sideris et al. | 324/431 |
| 5,811,959 A | * | 9/1998 | Kejha | 320/126 |

FOREIGN PATENT DOCUMENTS

| | | |
|---|---|---|
| EP | 0 348 839 | 1/1990 |
| WO | 97 28574 | 8/1997 |

OTHER PUBLICATIONS

PTO–892, Paper #4 from Serial No. 08/887,844–Jul. 24, 2001.

* cited by examiner

Primary Examiner—Gregory J. Toatley, Jr.
(74) Attorney, Agent, or Firm—Robert A. Wilkes; Robert G. Hendry

(57) ABSTRACT

A controller controls a switch bank which can shunt a voltage source in parallel with each fuel cell in a stack. By controlling the voltage of the voltage source, the current through the fuel cell is directly controlled. By increasing the anode potential of the fuel cell through control of the voltage source, poisons deposited on the electrocatalyst are removed, thereby rejuvenating the fuel cell. Each fuel cell in a stack can be treated in turn, causing a reduction of the effects of electrocatalyst poison on stack performance.

4 Claims, 3 Drawing Sheets

FUEL CELL MANAGER

This application is a continuation-in-part of U.S. Ser. No. 08/887,844 filed Jul. 3, 1997, now U.S. Pat. No. 6,239,579, which claims benefit Provisional application 60/021,185 filed. Jul. 5, 1996.

FIELD OF THE INVENTION

The present invention relates to fuel cells and more specifically, to methods and devices which can manage the operational health of fuel cell stacks.

BACKGROUND OF THE INVENTION

The past few decades has seen an explosion of interest in environmental matters. One consequence of this has been the beginning of a movement away from fossil fuel based energy sources with their attendant effects on pollution. One seemingly viable alternative to such traditional energy sources, especially for automobiles, is the electrochemical fuel cell.

Electrochemical fuel cells convert reactants, namely fuel and oxidant fluid streams, to produce electric power and reaction products. Such cells can operate using various reactants—the fuel stream may be substantially pure hydrogen gas, a gaseous hydrogen-containing reformat stream, or methanol. The oxidant may be substantially pure oxygen or a dilute stream such as air containing oxygen.

One drawback to current fuel cells is the degradation in a cell's power output over time. Impurities, either from the fuel stream or generated from within the fuel cell as intermediate species during the fuel cell reactions, may be adsorbed or deposited on the surface of the anode electrocatalyst. This blocks portions of the electrocatalyst and prevents these portions from inducing the desired electrochemical fuel oxidation reaction. Such impurities pro known as electrocatalyst "poisons" and their effect on electrochemical fuel cells is known as "electrocatalyst poisoning". Such "poisoning" reduces fuel cell performance by reducing the voltage output from the cell for that cell's current density. The deposit of electrocatalyst poisons may be cumulative—over time, even minute concentrations of poisons in a fuel stream may result in a degree of electrocatalyst poisoning which hampers fuel cell performance.

The sources of such poisons, as mentioned above, are legion. Reformat streams derived from hydrocarbons or oxygenated hydrocarbons typically contain a high concentration of hydrogen fuel but also typically contain electrocatalyst poisons such as carbon monoxide. Because of such a presence, the fuel stream may be pre-treated prior to its direction to the fuel cell. Pre-treatment method may employ catalytic or other methods to convert carbon monoxide to carbon dioxide. Unfortunately, pre-treatment methods cannot efficiently remove all of the carbon monoxide. Even trace amounts such as 10 ppm can eventually result in electrocatalyst poisoning.

Fuel cell components and other fluid streams in the fuel cell may also be a source of impurities. As an example, fuel cell separator plates are commonly made from graphite. Organic impurities in graphite may leech out and poison the electrocatalyst. Other poisons may be generated by the reaction of substance in the reactant streams with the fuel cell component materials. A further possible source of poison is from intermediate products in the oxidation process. For cells which use complex fuels such as methanol, this is particularly important.

A few methods have been developed which attempt to overcome the electrocatalyst poisoning issue. The anode may be purged with an inert gas such as hydrogen. However, this method involves suspending power generation by the fuel cell. Another approach is that of introducing a "clean" fuel stream containing no carbon dioxide or other poisons to A poisoned fuel cell anode. Where the adsorption is reversible, an equilibrium process results in some rejuvenation of the electrocatalyst. However, such a method is not effective against irreversibly adsorbed poisons. Furthermore, the recovery of the anode electrocatalyst by such an equilibrium process can be very slow, during which time the fuel cell is unable to operate at full capacity.

Yet another approach is to continuously introduce a low concentration of oxygen into the fuel stream upstream of the fuel cell, as disclosed by Gottesfeld in U.S. Pat. No. 4,910,099. Unfortunately, this approach has its own drawbacks, such as parasitic losses from oxygen bleed, undesirable localized exothermic reactions at the anode, and dilution of the fuel stream.

Wilkinson et al in U.S. Pat. No. 6,096,448 discloses periodic fuel starvation of the anode to increase the anode potential. This oxidizes and removes electrocatalyst poisons. Wilkinson describes three methods of accomplishing this fuel starvation: momentary interruption or the fuel supply by closing valves both upstream and downstream of the fuel supply, periodically introducing pulses of fuel free fluid into the fuel supply, and momentarily increasing the electrical load on the cell without increasing the fuel supply. With each of these methods, the anode potential rises because or fuel depletion at the anode. Unfortunately, none of these methods allow direct control the anode potential. Furthermore, treatment is applied on a stack basis and hence necessarily causes disruption of stack performance. If a fuel cell is not performing properly, the voltage source can also be used to supplement or replace the malfunctioning fuel cell.

From the above, there is therefore a need for devices and methods which address the issue of electrocatalyst poisoning while avoiding the problems associated with the efforts described

SUMMARY OF THE INVENTION

The present invention provides methods and devices which alleviate the effects of electrocatalyst poisoning while avoiding the problems encountered by the prior art. A controller controls a switch bank which can shunt a voltage source in parallel with each fuel cell in a stack. By controlling the voltage of the voltage source, the current through the fuel cell is directly controlled. By increasing the anode potential of the fuel cell through control of the voltage source, poisons deposited on the electrocatalyst are removed, thereby rejuvenating the fuel call. Each fuel cell in a stack can be treated in turn, causing a reduction of the effects of electrocatalyst poison on stack performance, If a fuel cell is not performing properly, the voltage source can also be used to supplement or replace the malfunctioning fuel sell.

In a first aspect the present invention provides a device for reducing catalyst poisons in an individual fuel cell in a stack while said stack is in use, said stack having plurality of fuel cells coupled to each other In series, said device comprising;

a switch bank coupled to each fuel cell in the stack;

a controller controlling said switch bank;

measuring means to measure a voltage, said measuring means being coupled to said switch bank and to the controller; and a variable voltage source coupled to the switch bank and to the controller, wherein
said switch bank can couple the variable voltage source in parallel with any one of the plurality of fuel cells in said stack;
said switch bank can couple said measuring moans to a fuel cell in the stack such that said measuring means can measure a voltage across said fuel cell;
said controller controls a voltage setting of said variable voltage source and which fuel cell in said stack is coupled in parallel with said variable voltage source.

In a second aspect the present invention provides a method of reducing catalyst poisons in a fuel cell in a stack of fuel cells while said stack is in use, said method comprising:

a) choosing a fuel cell for which catalyst poisons are to be reduced;
b) determining a voltage across said fuel cell;
c) setting a voltage setting for a variable voltage source, said voltage setting being greater than said voltage across said fuel cell; and
d) momentarily coupling said variable voltage source to be in parallel with said cell.

In a third aspect the present invention provides a device for a stack having multiple fuel cells in the invent that a fuel cull in said stack is unable to produce its required power output, said device comprising:

a switch bank coupled to each fuel cell in the stack;
a controller controlling said switch bank;
measuring means to measure a voltage, said measuring means being coupled to said switch bank and to the controller; and
a variable voltage source coupled to the switch bank and to the controller,
wherein
said switch bank can couple the variable voltage source in parallel With any one of the plurality of fuel cells in said stack;
said switch bank can couple said measuring means to a fuel cell in the stack such that said measuring means can measure a voltage across said fuel cell;
said controller controls a voltage setting of said variable voltage source and which fuel call in said stack is coupled in parallel with said variable voltage source.

BRIEF DESCRIPTION OF THE DRAWINGS

A better understanding of the invention may be obtained by reading the detailed description of the invention below, in conjunction with the following drawings, in which.

DETAILED DESCRIPTION OF THE PREFERRED EMBODIMENT

Figure 1:
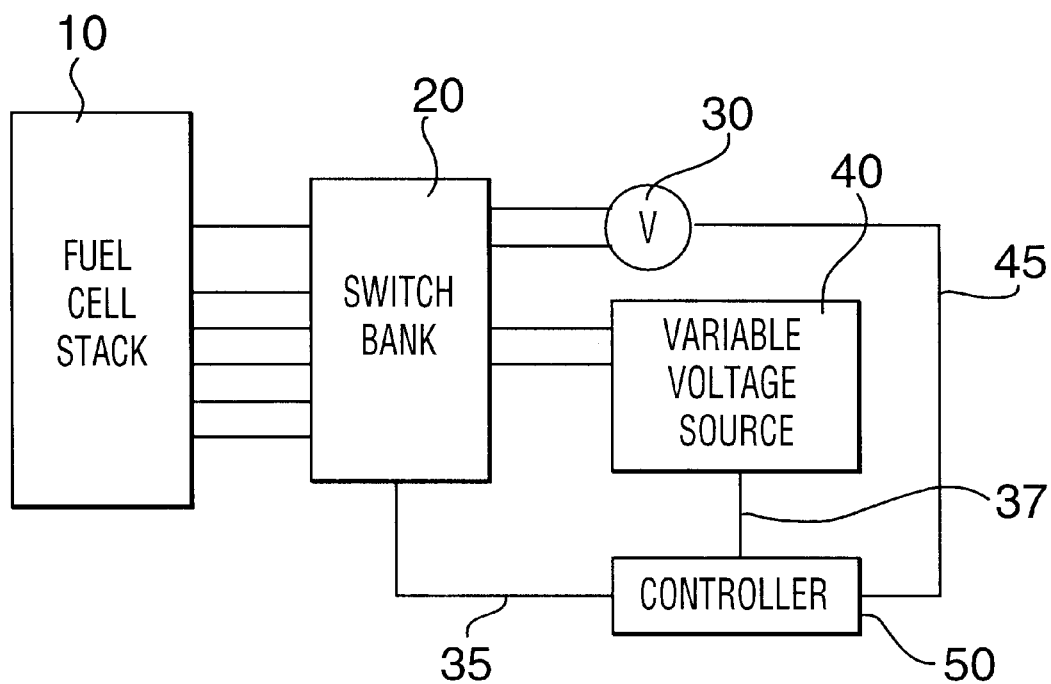
FIG. 1 is a block diagram of a management system for fuel cells according to the invention.

Referring to FIG. 1, a block diagram of a fuel cell manager according to the invention is illustrated. A fuel cell stack 10 is coupled to a switch bank 20. The switch bank is coupled to a voltage sensing device 30 and a variable voltage source 40. The switch bank 20, voltage sensing device 30, and variable voltage source 40 are all coupled to a controller 50. The controller 50 controls the switches within the switch bank 20 through line 35. The controller also controls the voltage setting of the variable voltage source 40 through line 37. The controller also receives the output of the voltage sensing device 30 through line 45.

Figure 2:
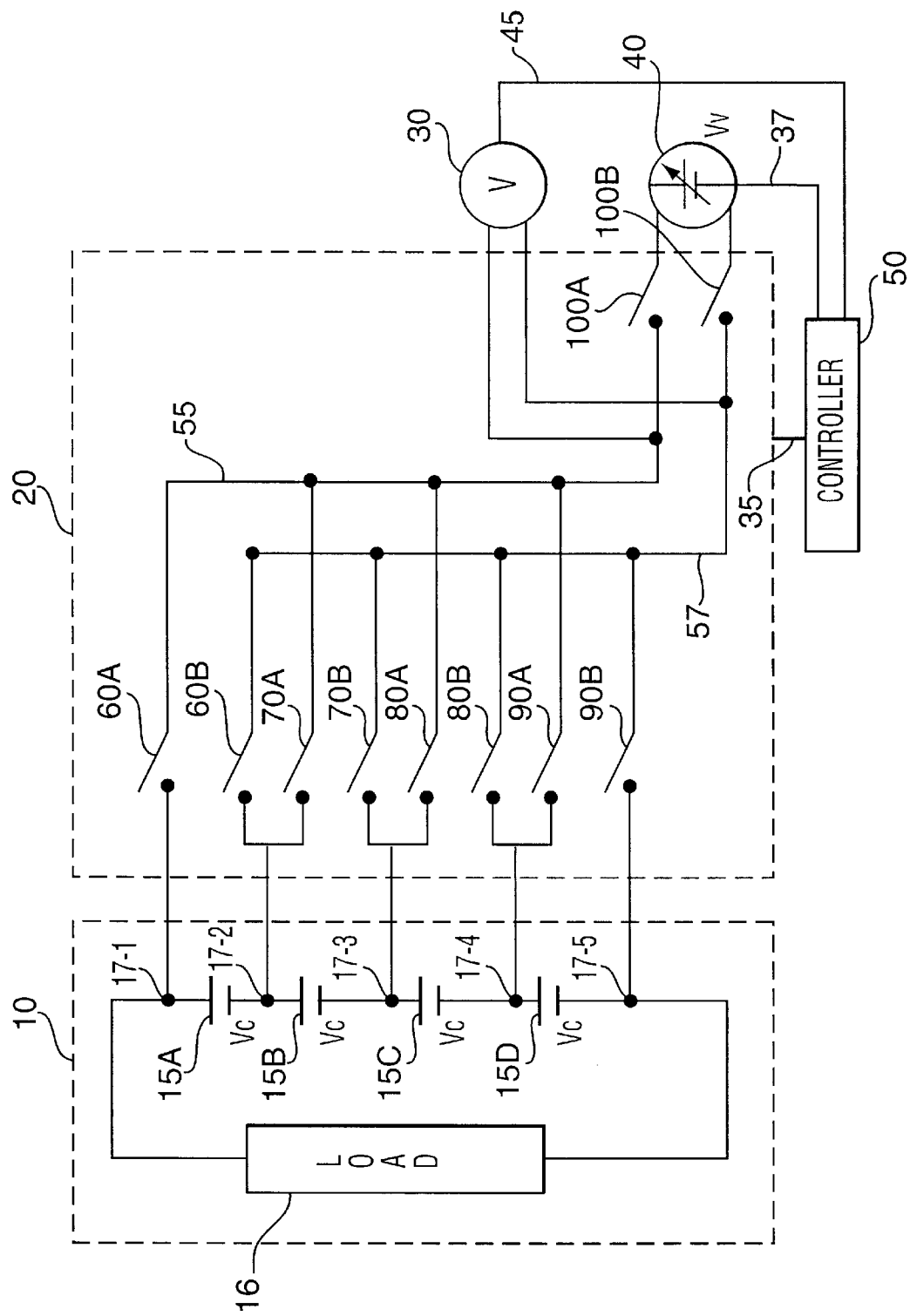
FIG. 2 is a detailed circuit diagram of the management system illustrated in FIG. 1.

Referring to FIG. 2, a more detailed diagram of FIG. 1 is illustrated, showing some of the details of the switch bank 20 and the fuel cell stack 10. The fuel cell stack 10 has fuel cells 15A, 15B, 15C, and 15D in series with one another. Also coupled to the fuel cells is a load 16. Load 16 is coupled at a first end to fuel cell 15A and at a second end to fuel cell 15D. While a load 16 is generally not considered nor required to be illustrated as part of a fuel cell stack, it has been included with the stack for simplicity. Also illustrated in FIG. 2 as being within the fuel cell stack 10 are connection points 17-1, 17-2, 17-3, 17-4, and 17-5. Connection point 17-1 is located between the first end of load 16 and cell 15A. Connection point 17-2 is located between cells 15A and 15B. Connection point 17-3 is located between cells 15B and 15C. Connection point 17-4 is located between cells 15C and 15D. Connection point 17-5 is between the second end of load 16 and cell 15D.

Within the switch bank 20 are lines 55 and 57 along with switches 60A, 60B, 70A, 70B, 80A, 80B, 90A, 90B, 100A, and 100B. As can be seen, switch 60A is between connection point. 17-1 and line 55. Switch 70A is between connection point 17-2 and line 55 while switch 70A is between connection point 17-3 and line 55. Switch 90A is between connection point 17-4 and line 55. Switch 60B is between connection point 17-2 and line 57 while switch 70B is between connection point 17-3 and line 57. Switch 80B is between connection point 17-4 and line 57 while switch 90B is between connection point 17-5 and line 57. The voltage sensing device 30 is coupled to line 55 at one lead and to line 57 at another. Switch 100A is between a lead of the voltage sensing device 30 and a lead of the variable voltage source. Switch 100B is between another lead of the voltage sensing device and another lead of the variable voltage source. It should be noted that while a 4 cell stack is illustrated in FIG. 2, the design can be extend to include as many fuel cells as required. It should also be clear that the addition or fuel sells to the stack would require additional switches in the switch bank to couple the additional fuel cells to the lines 55 and 57.

As can be seen, closing switches 60A and 60B and leaving all other switches open effectively couples the voltage sensing device across cell 15A. Similarly, closing switches 70A and 70B while leaving all other switches open accomplishes the same result for cell 15B. Thus, switches 60A and 60B are associated with cell 15A, switches 70A and 70B are associated with cell 15B, switches 80A and 80B are associated with cell 15C, and switches 90A and 90B are associated with cell 15D. Associated with the variable voltage source 40 are switches 100A and 100B. If the switches associated with a specified cell are closed and the switches associated with the voltage source are also closed, the voltage source is effectively shunted in parallel with the specified cell.

By closing only the switches associated with a source or cell, the voltage sensing device 30 can measure the voltage across such cell or source.

The system works by determining the voltage across one of the fuel cells. If this voltage is does not meet a threshold, then the cell is determined to require rejuvenation. A proper voltage setting for the variable voltage source is determined and then the variable voltage source is shunted to be in parallel with the cell in question. If the voltage setting is properly chosen, then the poisons deposited on the electrocatalyst within the fuel cell is oxidized and the cell is rejuvenated.

On a theoretical level, the system works by controlling the flow of current through either the variable voltage source, the cell in question, or both. If the voltage source is shunted in parallel to the cell, the voltage setting ($V_v$) for the voltage source is crucial. If the voltage source voltage is equal to the cell voltage ($V_c$), then no current will flow through the voltage source. If the voltage source voltage is equal to the open circuit voltage of the cell, then no current will flow through the cell and all of the current will flow through the variable voltage source. In general, if the voltage source voltage is less than the voltage of the cell, then current through the cell will be increased with some current flowing backward through the variable voltage source. Therefore, if the voltage source is shunted in parallel to the cell in question, then cell is rejuvenated by the oxidation of the electrocatalyst poisons already deposited.

Figure 3:
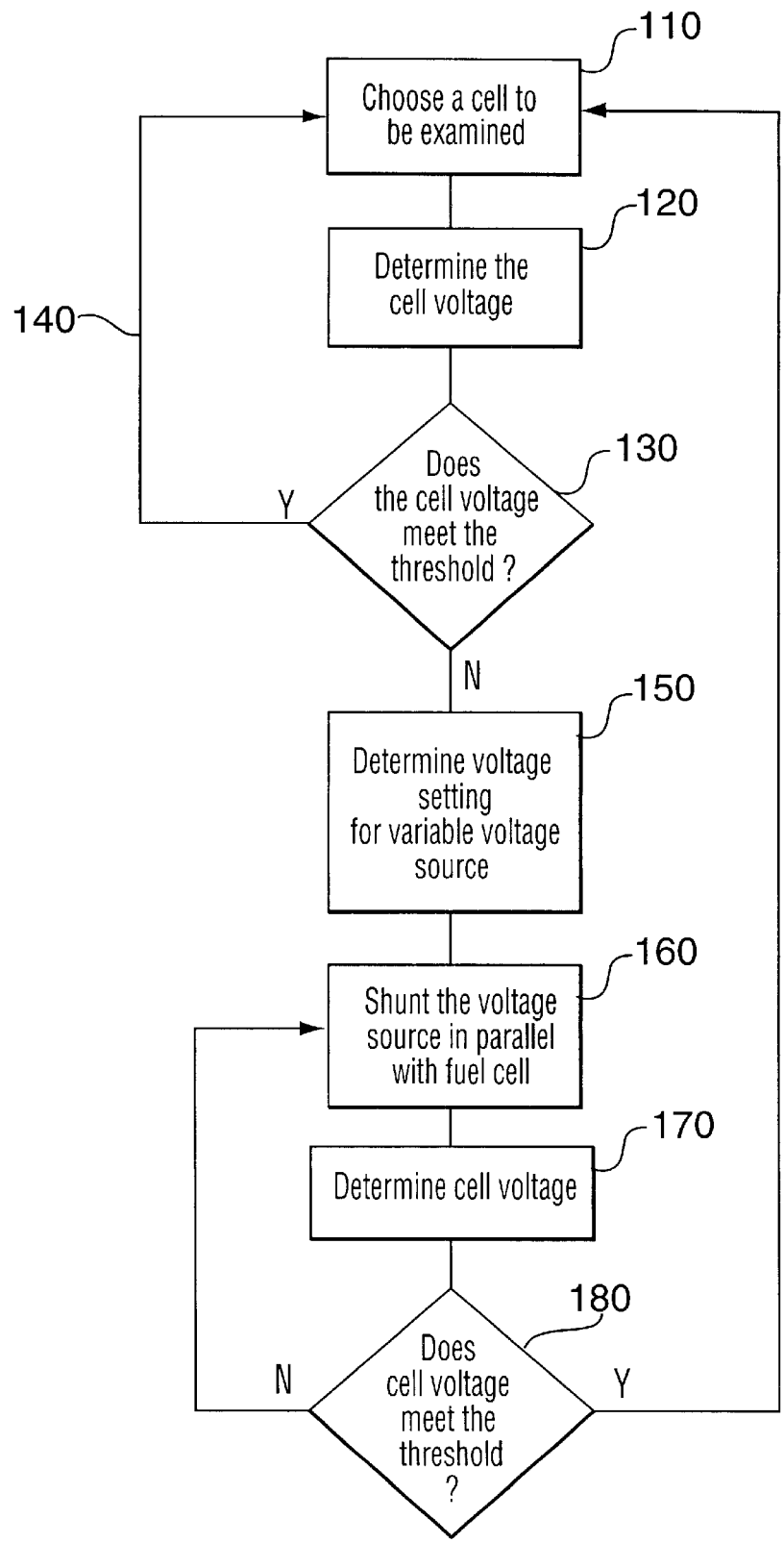
FIG. 3 is a flow chart detailing the steps of the method of the invention.

The following steps are thus taken by the system in rejuvenating a cell in a stack (as illustrated in FIG. 3):

a) choose a cell (step 110)
b) determine the cell voltage (step 120)
c) determine if the cell voltage meets a threshold (step 130)
d) if the cell voltage meets a threshold, then return to step a) to choose another cell (step 140)
e) if the cell voltage does not meet a threshold, then the cell requires rejuvenation and the following steps are executed (step 130):
  e1) determine a voltage setting for the variable voltage source (step 150)
  e2) momentarily shunt the variable voltage source in parallel with the cell being rejuvenated (step 160)
  e3) determine if the cell voltage meets the threshold (step 180)
  e4) if the cell voltage meets the threshold, then the cell is rejuvenated and another cell needs to be chosen (step 180)
  e5) if the cell voltage does not meet the threshold then steps e2) to e5) are repeated.

It should be noted that the shunting of the variable voltage source is momentary, This is done to be able to properly control the increments by which the cell in question is being rejuvenated. It should also be noted that different voltage/current pulses could be used in the rejuvenation process by merely controlling the opening and closing or the switches 100A and 100B and by controlling the voltage setting of the voltage source. There is, in fact, some evidence that a short duration reversal of the cell potential is beneficial to the cell. This can be implemented again by merely controlling the voltage setting of the variable voltage source.

Concerning the threshold value, this value will have to be determined for the specific type of fuel cell and the amount of cell health required by the user.

The programing and control of the system is, as noted above, contained in the controller. Thus, by properly programming the controller, periodic tests of the each of the individual cells can be carried out automatically. Any cell which is lagging in performance to its neighbors can be rejuvenated to an acceptable level. This enhances the performance of the stack as a whole.

A further benefit of the above system is that the system can insure against a cell failure causing stack failure. If a specific cell fails, the variable voltage source can be used as an interim or permanent replacement to the failed cell. By shunting the voltage source across a failed call and setting the voltage of the variable voltage source to be that of a healthy cell, the stack will continue to work at a proper level. Catastrophic stack failure is therefore averted, allowing qualified personnel to arrive and replace the failed cell or the stack as a whole.

The above benefit is more advantageous than previous attempts at shunting current around defective fuel cells. U.S. Pat. No. 6,096,449 describes using a diode to shunt the current around a defective cell. This use of a diode and the lack of a replacement or supplement power source causes the stack to not only lose the power of the defective cell but also the voltage required to turn on the diode. For a small stack, this power loss can be a significant portion of the amount of power the stack can deliver. With the present invention, there is no voltage change as the variable power source acts as the replacement or supplement to the defective cell.

As a further benefit, the variable voltage source need not only replace the defective cell. If a weak cell is incapable of being rejuvenated, perhaps because of age of some other factor, the variable voltage sourced can supplement the power from the weak cell. This can be done by, again, controlling the voltage setting of the variable voltage source prior to shunting it in parallel with the weak cell.

Regarding implementation, the switch bank can be either solid state or regular switches. The controller is ideally a programmable microcontroller drawing a minimum of power while the voltage sensing device can be a voltmeter or other device which can measure voltage and transmit its readings to the controller. The variable voltage source can be implemented by using a battery with suitable circuitry to control its output voltage.

As an alternative, the variable voltage source can be powered by the fuel cell itself. The fuel cell output can be fed into a DC-DC converter with the converter's output being used to power the variable voltage source.

A person understanding the above-described invention may now conceive of alternative designs, using the principles described herein. All such designs which fall within the scope of the claims appended hereto are considered to be part of the present invention.

For optimum performance, the system should continuously monitor the temperature of each cell along with the output vole. This continuous monitoring would be advantageous as it would serve as a warning if any cell were about to malfunction. Ideally, the controller would keep a track history of not only the temperature but the output voltage of each cell as well. Then, based on these measurements, the health or each cell can be determined and whichever cell has tho least amount of health, based on a user's programmed criteria, can be given the proper attention by the system. If a cell, based on its readings, were considered to be unhealthy, the system would then switch to that cell and perform the rejuvenation process on that cell. This whole process including continuous monitoring, selection of a particular cell, and rejuvenation of the individual cells, is performed while the stack continues to service its load.

It should be noted that to monitor the temperature of a cell, a suitable means must be used. This can take the form of a temperature lead attached to each cell with the lead being coupled to a temperature determining device from which the controller receives temperature readings.

For continuous voltage readings or a cell's output voltage, the system con periodically switch to a cell to perform voltage measurements. Given the ease at which voltage readings can be made, this sampling of a cell's voltage can be carried out as frequently as required by a user's reprogrammed criteria.

What is claimed is:

1. A device for reducing catalyst poisons in an individual fuel cull in a stack while said stack is in use, said stack having plurality of fuel cells coupled to each other in series, said device comprising:

a switch bank coupled to each fuel cell in the stack;

a controller controlling said switch bank;

measuring means to measure a voltage, said measuring means being coupled to said switch bank and to the controller; and a variable voltage source coupled to the switch bank and to the controller, wherein said switch bank can couple the variable voltage source in parallel with any one of the plurality of fuel cells in said stack;

said switch bank can couple said measuring means to a fuel cell in the stack such that said measuring means can measure a voltage across said fuel cell; and said controller controls a voltage setting of said variable voltage source and which fuel cell in said stack is coupled in parallel with said variable voltage source.

2. A method of reducing catalyst poisons in a fuel cell in a stack of fuel cells while said stack is in use, said method comprising:

a) choosing a fuel cell for which catalyst poisons are to be reduced;

b) determining a voltage across said fuel cell;

c) setting a voltage setting for a variable voltage source, said voltage setting being greater than said voltage across said fuel cell; and d) momentarily coupling said variable voltage source to be in parallel with said cell.

3. A method as in claim 2 further including the steps of:

e) repeating steps b) to d) until said voltage across said fuel cell meets a threshold value.

4. A device for a stack having multiple fuel cells in the invent that a fuel cell in said stack is unable to produce its required power output, said device comprising:

a switch bank coupled to each fuel cell in the stack;

a controller controlling said switch bank;

measuring means to measure a voltage, said measuring means being coupled to said switch bank and to the controller; and a variable voltage source coupled to the switch bank and to the controller, wherein said switch bank can couple the variable voltage source in parallel with any one of the plurality of fuel cells in said stack;

said switch bank can couple said measuring means to a fuel cell in the stack such that said measuring means can measure a voltage across said fuel cell;

said controller controls a voltage setting of said variable voltage source and which fuel cell in said stack is coupled in parallel with said variable voltage source.

* * * * *